United States Patent
Baldauf et al.

(10) Patent No.: US 8,580,643 B2
(45) Date of Patent: Nov. 12, 2013

(54) THRESHOLD VOLTAGE ADJUSTMENT IN A FIN TRANSISTOR BY CORNER IMPLANTATION

(75) Inventors: Tim Baldauf, Dresden (DE); Andy Wei, Dresden (DE); Tom Herrmann, Dresden (DE); Stefan Flachowsky, Dresden (DE); Ralf Illgen, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 56 days.

(21) Appl. No.: 13/217,009

(22) Filed: Aug. 24, 2011

(65) Prior Publication Data

US 2013/0049121 A1 Feb. 28, 2013

(51) Int. Cl.
*H01L 21/336* (2006.01)
(52) U.S. Cl.
USPC .................................. 438/289; 257/E29.264
(58) Field of Classification Search
USPC .................... 257/365, E29.266; 438/157, 289
See application file for complete search history.

(56) References Cited

U.S. PATENT DOCUMENTS

| 2008/0050866 | A1* | 2/2008 | Booth et al. ................. 438/157 |
| 2011/0042748 | A1* | 2/2011 | Anderson et al. ............ 257/365 |
| 2011/0079861 | A1* | 4/2011 | Shifren et al. ................ 257/402 |
| 2011/0147812 | A1* | 6/2011 | Steigerwald et al. ......... 257/288 |
| 2012/0313170 | A1* | 12/2012 | Chang et al. ................. 257/347 |

* cited by examiner

*Primary Examiner* — William D Coleman
*Assistant Examiner* — Christine Enad
(74) *Attorney, Agent, or Firm* — Williams, Morgan & Amerson, P.C.

(57) ABSTRACT

When forming sophisticated multiple gate transistors and planar transistors in a common manufacturing sequence, the threshold voltage characteristics of the multiple gate transistors may be intentionally "degraded" by selectively incorporating a dopant species into corner areas of the semiconductor fins, thereby obtaining a superior adaptation of the threshold voltage characteristics of multiple gate transistors and planar transistors. In advantageous embodiments, the incorporation of the dopant species may be accomplished by using the hard mask, which is also used for patterning the self-aligned semiconductor fins.

20 Claims, 11 Drawing Sheets

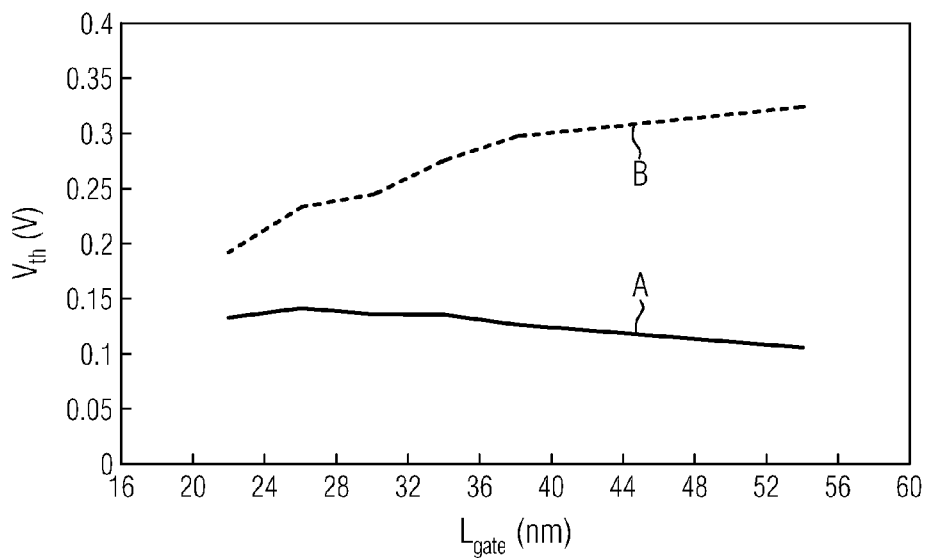
FIG. 1d
(prior art)
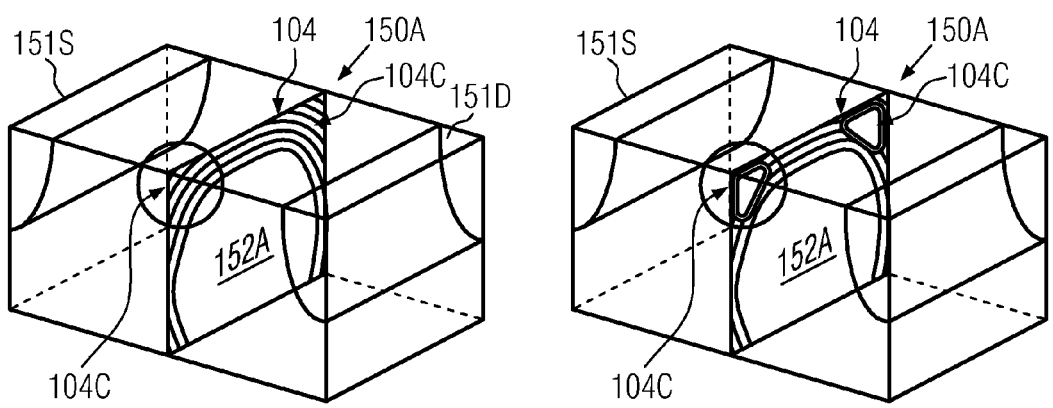
FIG. 1e
(prior art)
FIG. 1f
(prior art)

THRESHOLD VOLTAGE ADJUSTMENT IN A FIN TRANSISTOR BY CORNER IMPLANTATION

BACKGROUND OF THE INVENTION

1. Field of the Invention

Generally, the present disclosure relates to highly sophisticated integrated circuits including transistor elements having a double gate or triple gate architecture (FinFET).

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout, wherein field effect transistors represent one important type of circuit element that substantially determines performance of the integrated circuits. Generally, a plurality of process technologies are currently practiced, wherein, for many types of complex circuitry including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface positioned between highly doped regions, referred to as drain and source regions, and a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a planar transistor architecture, the distance between the source and drain regions, which is also referred to as channel length.

Presently, the vast majority of integrated circuits are based on silicon due to substantially unlimited availability, the well-understood characteristics of silicon and related materials and processes and the experience gathered during the last 50 years. Therefore, silicon will likely remain the material of choice for future circuit generations designed for mass products. One reason for the dominant importance of silicon in fabricating semiconductor devices has been the superior characteristics of a silicon/silicon dioxide interface that allows reliable electrical insulation of different regions from each other. The silicon/silicon dioxide interface is stable at high temperatures and thus allows the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a gate insulation layer that separates the gate electrode, frequently comprised of polysilicon or metal-containing materials, from the silicon channel region. In steadily improving device performance of field effect transistors, the length of the channel region has been continuously decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length for a planar transistor configuration requires an increased capacitive coupling to avoid the so-called short channel behavior during transistor operation. The short channel behavior may lead to an increased leakage current and to a dependence of the threshold voltage on the channel length. The threshold voltage is the voltage applied across the gate electrode and the transistor body at which a conductive channel begins to form in the channel region. Aggressively scaled transistor devices with a relatively low supply voltage and thus reduced threshold voltage may suffer from an exponential increase of the leakage current, while also requiring enhanced capacitive coupling of the gate electrode to the channel region. Thus, the thickness of the silicon dioxide layer has to be correspondingly decreased to provide the required capacitance between the gate and the channel region. The relatively high leakage current caused by direct tunneling of charge carriers through an ultra-thin silicon dioxide gate insulation layer may reach values for an oxide thickness in the range of 1-2 nm that may not be compatible with requirements for performance driven circuits.

In view of further device scaling, possibly based on well-established materials, new transistor configurations have been proposed in which a "three dimensional" architecture is provided in an attempt to obtain a desired channel width, while at the same time superior controllability of the current flow through the channel region is preserved. To this end, so-called FinFETs have been proposed in which a thin sliver or fin of silicon is formed in a silicon layer of substrate, wherein on both sidewalls and, if desired, on a top surface, a gate dielectric material and a gate electrode material are provided, thereby realizing a multiple gate transistor whose channel region may be fully depleted. For convenience, the terms multiple gate transistor and FinFET will be used herein as interchangeable terms. Typically, in sophisticated applications, the width of the silicon fins is on the order of magnitude of 10-25 nm and the height thereof is on the order of magnitude of 30-40 nm. In some conventional approaches for forming FinFETs, the fins are formed as elongated device features followed by the deposition of the gate electrode materials, possibly in combination with any spacers, and thereafter the end portions of the fins may be "merged" by epitaxially growing a silicon material, which may result in complex manufacturing processes, thereby also possibly increasing the overall external resistance of the resulting drain and source regions.

For this reason, process strategies have been developed in which the semiconductor fins are formed in a "self-aligned" manner with respect to the gate electrode structure, wherein the semiconductor fins are restricted to the area covered by the gate electrode structure only, while the drain and source regions are preserved as continuous semiconductor regions, thereby eliminating any additional epitaxial growth techniques. Corresponding manufacturing strategies are, for instance, disclosed in non-published German patent applications by NDY et al. entitled "A self-aligned multiple gate transistor formed on a bulk substrate" and "A self-aligned fin transistor formed on a bulk substrate by late fin etch," respectively. The disclosure of these German patent applications is herein incorporated by reference in its entirety.

Generally, these process strategies enable the formation of FinFET or multiple gate transistors on the basis of "two-dimensional" manufacturing processes so that three-dimensional transistors and conventional planar transistors may be provided concurrently without requiring separate processes except for the actual formation of the self-aligned semiconductor fins. Consequently, separate semiconductor devices in which the advantages of three-dimensional and two-dimensional transistors may be efficiently exploited may be fabricated on the basis of these process techniques, while at the same time not unduly contributing to the overall process complexity since many of the conventional two-dimensional process techniques, such as the formation of drain and source regions, gate electrode structures and the like, may be applied commonly for the multiple gate transistors and the planar transistors. Although the hybrid concept may basically have the potential of providing fast and powerful semiconductor devices at acceptable fabrication costs, it turns out that a significant variability of transistor characteristics, in particular of the threshold voltage of transistors of different gate length, is observed when comparing the multiple gate transistors with the planar transistors in the semiconductor device, as will be explained in more detail with reference to FIGS. 1a-1f.

FIG. 1a schematically illustrates a perspective view of a semiconductor device 100 which may include multiple gate transistors, such as tri-gate transistors and planar transistors, according to the overall device requirements. For convenience, in FIG. 1a, a multiple gate transistor 150A is illustrated, while any planar transistors are not shown. The device 100 comprises a substrate 101, such as a silicon substrate, a silicon/germanium substrate or any other appropriate carrier material for forming thereon a semiconductor layer 102, for instance in the form of a silicon material. Generally, the semiconductor layer 102 is provided as a continuous semiconductor material at an initial manufacturing stage and may subsequently be divided into a plurality of semiconductor regions or active regions, wherein a single semiconductor region 102A is illustrated in FIG. 1a, in and above which the transistor 150A is formed. In other semiconductor regions, any other multiple gate transistors or planar transistors are provided in the device 100 as required in view of the overall circuit layout of the device 100. The semiconductor region 102A comprises a plurality of semiconductor fins 104 which are laterally positioned between a source region 151S and a drain region 151D. Furthermore, a dielectric material 103 is formed laterally adjacent to the semiconductor fins 104 and extends up to a height level that is recessed with respect to the surface of the semiconductor region 102A. In this manner, the dielectric material 103 substantially defines the electrically effective height of the semiconductor fins 104, which is to be understood as the vertical extension of the exposed portion of the semiconductor fins 104 in FIG. 1a. Moreover, a gate electrode structure 160A is provided above the semiconductor fins 104 and typically comprises an electrode material 162, such as a polysilicon material, an electrode metal and the like, in combination with a sidewall spacer structure 161 which may have any appropriate configuration. Furthermore, the gate electrode structure 160A comprises a gate dielectric material 163 which is provided so as to separate the electrode material 162 from the semiconductor fins 104, which represent the channel region of the transistor 150A. Consequently, the gate electrode material 163 is formed on a top surface 104T and on sidewall surface areas 104S of the semiconductor fins 104, while the electrode material 162 is formed on a dielectric material 163. Consequently, the sidewall surface areas 104S and the top surface 104T act as "planar" channel regions which are controlled by the "multiple" gate electrodes defined by the gate dielectric material 163 and the adjacent electrode material 162 formed on the corresponding surface areas 104T and 104S. Hence, in the configuration shown in FIG. 1a, the three surface areas 104S, 104T form a tri-gate configuration, wherein, however, the entire semiconductor fin 104 represents the channel region of the transistor 150A, which may thus be controlled by the combination of these multiple gates, as is also discussed above.

FIG. 1b schematically illustrates a perspective view of the device 100, wherein, for convenience, the gate electrode structure 160A (FIG. 1a) is not shown. Moreover, for convenience, a single semiconductor fin 104 is illustrated in FIG. 1b. As shown, the drain and source regions 151D, 151S have a dedicated lateral and vertical dopant profile which may be obtained on the basis of conventional planar transistor manufacturing techniques, for instance by performing implantation processes, so that the drain and source regions 151S, 151D electrically connect to the semiconductor fin 104, which acts as a channel region 152A of the transistor 150A, as discussed above.

FIG. 1c schematically illustrates a top view of the device 100 wherein the multiple gate transistor 150A is illustrated. For convenience, with the single semiconductor fin 104 acting as the channel region 152A for connecting the drain and source regions 151S, 151D, while, in a second semiconductor region 102B, a planar transistor 150B is provided in which a gate electrode structure 160B is formed above a planar channel region 152B that continuously laterally connects to drain and source regions 151S, 151D, respectively. The transistors 150A, 150B may have substantially the same gate length, i.e., in FIG. 1c, the horizontal distance between the drain and source regions 151S, 151D, and may also have substantially the same architecture with respect to the vertical and lateral dopant profile in the drain and source regions 151S, 151D since, as discussed above, the transistors 150A, 150B are typically formed by using process techniques that are commonly applied to the transistors 150A, 150B, except for the actual formation of the semiconductor fin 104.

For example, a typical process strategy for forming the semiconductor device 100 as shown in FIGS. 1a-1c may comprise the following process sequence. After forming the semiconductor regions 102A, 102B (FIG. 1c) by providing an appropriate isolation structure (not shown), which may include sophisticated lithography, etch, deposition, anneal and planarization techniques, the basic doping of the various semiconductor regions is established by using appropriate implantation and masking techniques. Thereafter, a mask may be formed so as to include a gate opening, which basically determines the lateral size and position of the gate electrode structures 160A, 160B. To this end, well-established deposition, lithography and etch techniques are applied. Thereafter, an appropriate hard mask is provided to define the position and lateral dimensions of the semiconductor fins 104 within the gate opening for the transistor 160A. To this end, any sophisticated deposition and patterning techniques are applied. Thereafter, an anisotropic etch process is performed to etch into the semiconductor region 102A, thereby forming the semiconductor fin 104 down to a specific depth. Thereafter, a dielectric material, such as silicon dioxide, is filled into the recesses laterally adjacent to the resulting semiconductor fin 104, while excess material is removed by planarization and etch techniques, thereby also adjusting a desired height level for the dielectric material 103 (FIG. 1b), thereby also adjusting the effective electrical height of the semiconductor fins 104. It should be appreciated that the semiconductor region 102B for the planar transistors is reliably covered by the hard mask in order to avoid any undue material erosion in a corresponding gate opening for the transistor 150B. After the removal of the hard mask, the gate electrode structures 160A, 160B may be formed by depositing any appropriate materials, such as a gate dielectric material 163 and the electrode material 162 (FIG. 1a), followed by the removal of the corresponding mask. In this manufacturing stage, the gate electrode structures 160A, 160B may be used as implantation masks for the further processing, i.e., for forming the drain and source regions 151S, 151D in order to establish the required complex vertical and lateral dopant profile. For example, the implantation sequences for forming the drain and source regions 151S, 151D may include an implantation process for incorporating drain and source dopant species with reduced implantation energy and possibly with reduced dose, while typically a counter-doping species is also incorporated, possibly on the basis of tilted implantation techniques, in order to adjust the overall transistor characteristics and in particular the threshold voltage of the transistors 150A, 150B. To this end, well-established masking regimes and implantation techniques, in combination with corresponding cleaning recipes that have to be provided upon removing a resist mask, are applied. Consequently, the various mechanisms that can influence the finally obtained threshold voltage of the transistors 150A, 150B are typically commonly applied to these transistors so that a change in threshold voltage of one type of transistor necessarily significantly affects the other type of transistor. It turns out, however, that the threshold voltages of the multiple gate transistors 150A significantly differ from the threshold voltages of the planar transistors 150B when transistors of different gate lengths are considered.

FIG. 1d schematically illustrates a typical dependency of the threshold voltage for planar and multiple gate transistors of different gate length when operated in a saturated state. Curve A represents the corresponding threshold voltage values for multiple gate transistors of gate lengths ranging from 22-54 nm, while curve B depicts the situation for the planar transistors 150B. Generally, the threshold voltages of the multiple gate transistors are significantly lower compared to the planar transistor which is assumed to be mainly affected by corner effects in the semiconductor fin 104. It is believed that one mechanism that results in a reduced threshold voltage is an increased segregation and out-diffusion of a well dopant species at the corner of the semiconductor fins 104. Furthermore, the overlap of the electric fields generated by the gate electrode structures acting from the top surface and the sidewall surface areas of the semiconductor fin 104, as discussed above, may also contribute to a reduced overall threshold voltage. Consequently, both geometry-dependent effects may result in higher electrostatic potential, lower conduction band energy and an increased current density at the corners of the semiconductor fins 104.

FIG. 1e schematically illustrates a typical doping concentration, for instance, in a section at the center of the semiconductor fin 104 and thus of the channel region 152A. As is evident from FIG. 1e, in the corner areas 104C of the fin 104, a reduced well dopant concentration is present which, as discussed above, in combination with a locally increased electric field, may result in higher current density in the corner areas 104C.

FIG. 1f schematically illustrates a corresponding simulation of the current density within the channel region 152A, thereby clearly indicating an increased charge carrier density at the corner areas 104C, thereby resulting in the overall reduced threshold voltage compared to the corresponding threshold voltage of the planar transistors, as is also evident from FIG. 1d when comparing curves A and B.

In order to reduce the mismatch of the threshold voltages between multiple gate transistors and planar transistors, in some strategies, the implantation of a counter-doping species into the channel regions, also referred to as halo implantation, is applied separately for the multiple gate transistors and the planar transistors. In this strategy, two additional implantation masks, implantation processes and associated cleaning steps are required for N-channel transistors on the one hand and P-channel transistors on the other hand. That is, the implantation sequence for forming halo regions, possibly in combination with corresponding drain and source extension regions, has to be performed twice for N-channel transistors and P-channel transistors in order to control the resulting threshold voltage differently for multiple gate transistors and planar transistors, respectively. In addition to significantly increased overall manufacturing costs, it turns out that the electrical behavior of the multiple gate transistors is degraded for different gate lengths, for instance in a range from 22-54 nm, in particular it turns out that only short channel transistors sufficiently respond to an increased counter-doping implantation dose in order to appropriately increase the threshold voltage (curve A in FIG. 1d), while, however, the multiple gate transistors of increased gate lengths, for instance of 54 nm, are hardly "degraded" due to less halo overlapping, while also the corner effects, described above with reference to FIGS. 1e and 1f, remain substantially unchanged. Furthermore, it has been observed that generally the dependency of the threshold voltage on the gate length of various transistors is more pronounced upon increasing the implantation dose of the counter-doping species or halo species upon forming the drain and source regions.

As a consequence, forming the complex vertical and lateral dopant profile of the drain and source regions separately, multiple gate transistors and planar transistors, for instance by separately using halo, i.e., counter-doping, implantation processes may result in a very complex manufacturing flow, while at the same time a significant mismatch between the multiple gate transistors and the planar transistors is still present, in particular for transistors having an increased gate length.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing techniques and semiconductor devices in which multiple gate transistors and planar transistors may be formed on the basis of drain and source regions having substantially the same dopant profile, for instance with respect to the drain and source dopant species and with respect to counter-doping species, while at the same time a superior matching of the threshold voltage behavior of multiple gate transistors and planar transistors for various gate lengths may be accomplished. To this end, it has been recognized that a local variation of the dopant concentration in the corner areas of the semiconductor fins may be very efficient so as to individually adjust the threshold voltage behavior of the multiple gate transistors substantially without affecting the planar transistors, wherein multiple gate transistors and planar transistors may have substantially the same drain and source dopant configuration. The local adjustment of the dopant concentration in the corner areas of the semiconductor fins may, in some illustrative embodiments, be accomplished by an ion implantation process, wherein an appropriate dopant species may be incorporated in a self-aligned manner into the corner areas, which may be accomplished by using a hard mask as an implantation mask, which may also be used as an etch mask upon patterning the semiconductor fins at any appropriate manufacturing stage. Consequently, a local adaptation of the dopant concentration, in particular of the corner areas of the semiconductor fins, may be accomplished without affecting the planar transistor by the corresponding implantation process so that the threshold voltage characteristics of the planar transistor and in part of the multiple gate transistors may be efficiently adjusted on the basis of well-established implantation techniques upon forming the drain and source regions commonly for the multiple gate transistors and the planar transistors.

One illustrative method disclosed herein comprises forming a hard mask above a semiconductor region, wherein the hard mask has at least one mask feature that determines a lateral size of a semiconductor fin to be formed in the semiconductor region. The method further comprises performing an implantation process to incorporate a dopant species at and near a surface of the semiconductor region, while using the hard mask as an implantation mask. The method further comprises performing an etch process to form the semiconductor fin in the semiconductor region, while the hard mask is used as an etch mask after performing the implantation process. Additionally, the method comprises forming a gate electrode structure above and laterally adjacent to the semiconductor fin.

A further illustrative method disclosed herein relates to forming a semiconductor device. The method comprises forming first drain and source regions of a multiple gate transistor in a first semiconductor region and second drain and source regions of a planar transistor in a second semiconductor region, wherein the multiple gate transistor comprises a semiconductor fin connecting to the first drain and source regions. The method further comprises separately adjusting a threshold voltage of the multiple gate transistor by providing a counter-doping species in the semiconductor fin so as to have a concentration maximum at upper corners of the semiconductor fin.

One illustrative semiconductor device disclosed herein comprises a semiconductor region comprising a drain region and a source region. The semiconductor device further comprises a channel region formed by at least one semiconductor fin that is formed in the semiconductor region so as to connect with a first end portion thereof to the drain region and so as to connect with a second end portion to the source region. The semiconductor fin comprises a counter-doping species having a concentration maximum locally at and along upper corners of the semiconductor fin. Moreover, the semiconductor device comprises a gate electrode structure formed above and laterally adjacent to the at least one semiconductor fin.

BRIEF DESCRIPTION OF THE DRAWINGS

The disclosure may be understood by reference to the following description taken in conjunction with the accompanying drawings, in which like reference numerals identify like elements, and in which:

FIG. 1d schematically illustrates a graph representing the threshold voltage behavior of multiple gate transistors and planar transistors for various gate lengths, according to conventional process strategies;

FIGS. 1e and 1f schematically illustrate perspective views of a dopant concentration and a current density, respectively, of a semiconductor fin of a conventional multiple gate transistor;

Figure 1A:
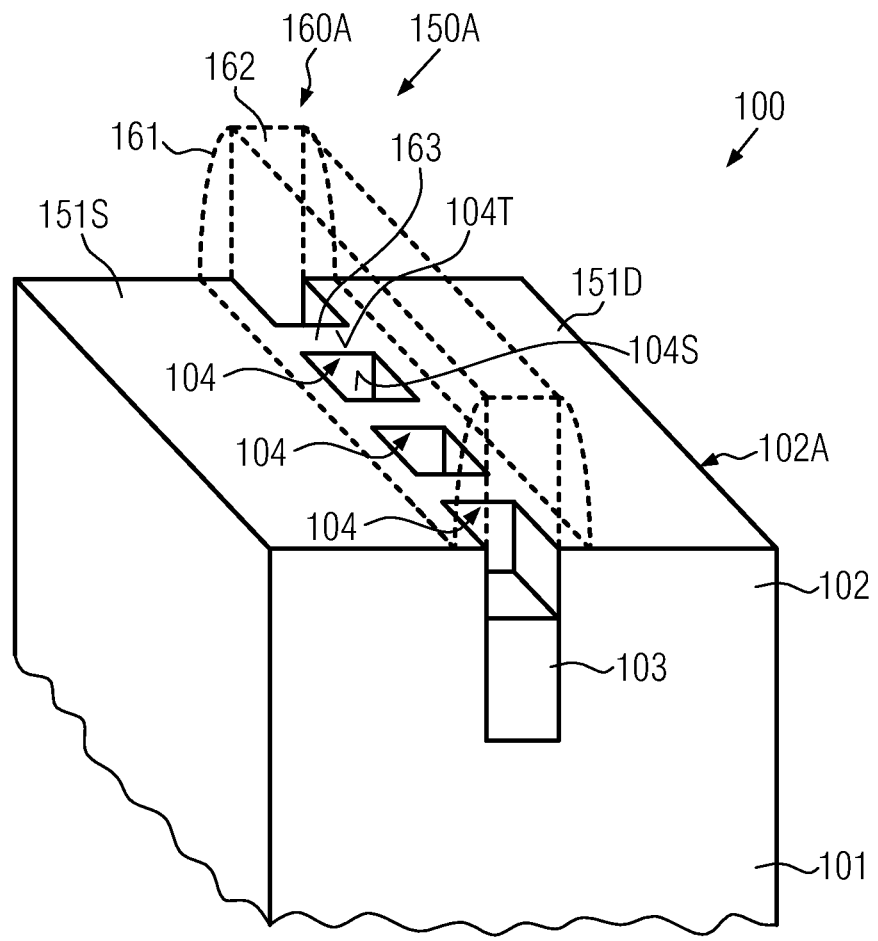
FIGS. 1a-1b schematically illustrate a perspective view of a multiple gate transistor formed on the basis of a conventional process strategy.
Figure 1B:
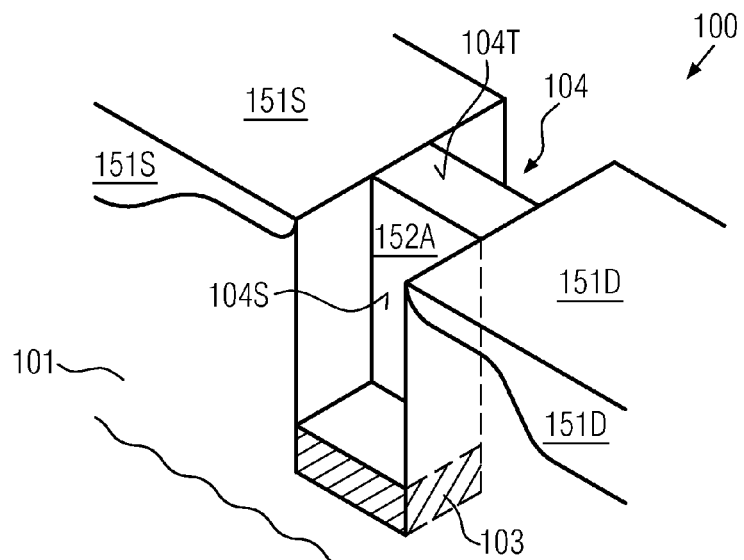
Figure 1C:
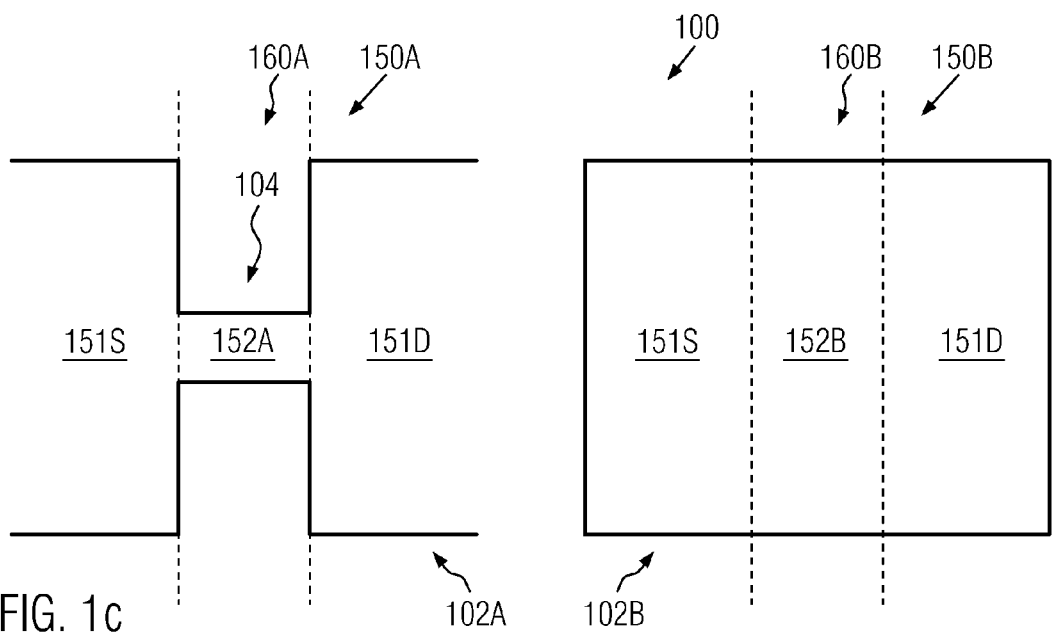
FIG. 1c schematically illustrates a top view of a multiple gate transistor and a planar transistor formed according to conventional process strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides semiconductor devices and manufacturing techniques in which the corner areas of semiconductor fins receive an appropriate dopant concentration so as to appropriately adapt the threshold voltage characteristics of multiple gate transistors for an otherwise given configuration of the drain and source areas and any counter-doped areas or halo regions of the multiple gate transistors. In this manner, the drain and source configuration may be established commonly for planar transistors and multiple gate transistors while the required adaptation of the threshold voltage characteristics may be achieved by incorporating the dopant species in a locally restricted manner into semiconductor fins with a concentration maximum in the corner area substantially without affecting the dopant concentration in the drain and source region of the multiple gate transistors and planar transistors. In this manner, the drain and source regions may be formed on the basis of a common process sequence. Furthermore, in some illustrative embodiments, the incorporation of the dopant species into the semiconductor fins may be accomplished on the basis of a hard mask, which is also used for patterning the semiconductor fins, such that an additional implantation mask is not required since the hard mask may also cover at least the channel area of the planar transistor.

The additional dopant species of the semiconductor fins may be incorporated at any appropriate manufacturing stage prior to actually patterning the semiconductor fins, thereby providing a high degree of compatibility with a plurality of process strategies for forming multiple gate transistors and planar transistors in a hybrid semiconductor device. For example, in some approaches, the hard mask for patterning the semiconductor fins may be provided on the basis of a mask which includes gate openings, wherein the implantation process may thus be performed prior to actually patterning the semiconductor fins within the corresponding gate opening of the multiple gate transistors. On the other hand, the corresponding gate opening of planar transistors is reliably covered by the hard mask material. During the implantation process, the unavoidable scattering of the dopant species in the semiconductor material at the bottom of the hard mask results in the incorporation of the dopant species into the area in which the actual semiconductor fins are to be subsequently formed on the basis of the hard mask and an anisotropic etch process. On the other hand, the penetration into the depth of the semiconductor material may be efficiently controlled by adjusting implantation dose and energy of the implantation process so as to obtain a desired concentration maximum at the corner areas after etching the semiconductor fins without unduly affecting any sidewall surface areas of the semiconductor fins. Consequently, by controlling at least one process parameter of the implantation process, a desired shift and thus a desired degree of matching of the threshold voltage characteristics may be achieved.

With reference to FIGS. 2a-2k, further illustrative embodiments will now be described in more detail, wherein reference may also be made to FIGS. 1a-1f, if appropriate.

Figure 2A:
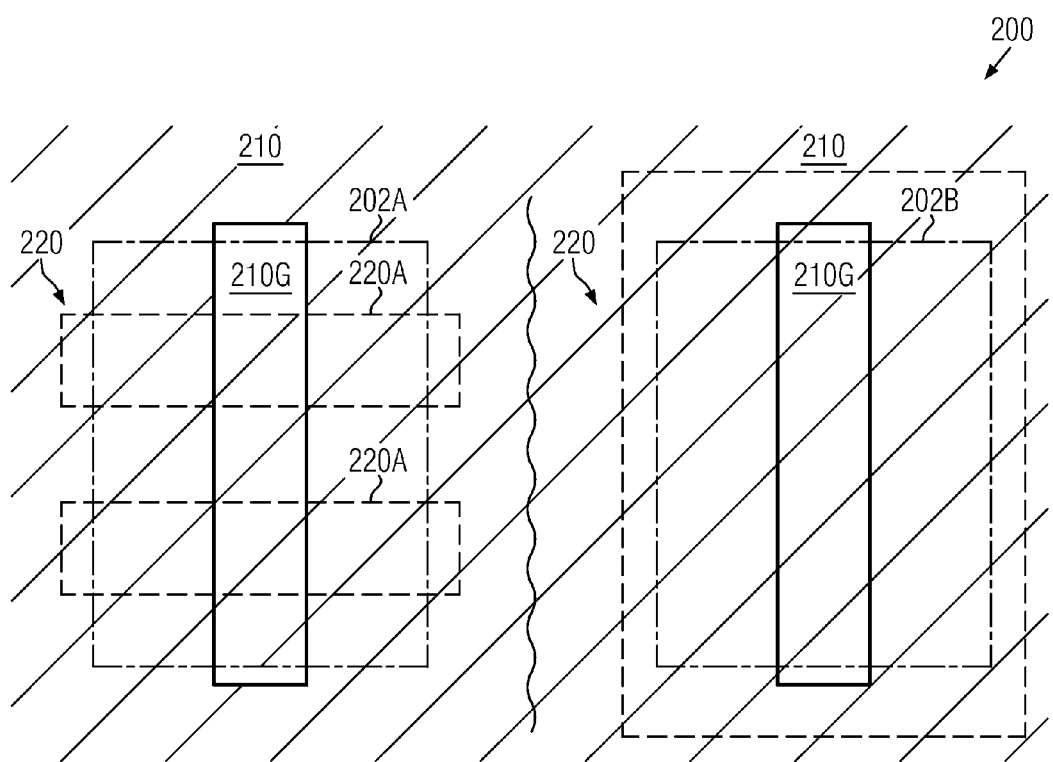
FIG. 2a schematically illustrates a top view of a semiconductor device comprising a multiple gate transistor and a planar transistor with a hard mask for defining the lateral position and size of semiconductor fins, according to illustrative embodiments.

FIG. 2a schematically illustrates a top view of a semiconductor device 200 comprising a first semiconductor region 202A in and above which a multiple gate transistor is to be formed and a second semiconductor region 202B in and above which a planar transistor is to be formed. The semiconductor regions 202A, 202B may be formed in any appropriate semiconductor material and may be laterally delineated by respective isolation structures, as is, for instance, also discussed above with reference to the semiconductor device 100. Furthermore, in this manufacturing stage, a gate mask 210 comprised of any appropriate material or material system may be formed above the semiconductor regions 202A, 202B and may comprise a gate opening 210G, which thus defines the lateral size and position of gate electrode structures to be formed above the semiconductor regions 202A, 202B. Furthermore, in this manufacturing stage, a hard mask 220 may be provided so as to define the lateral size and position of semiconductor fins to be formed in the gate opening 210G formed above the semiconductor region 202A. To this end, the hard mask 220 may comprise one or more mask features 220A, which may be used as an etch mask in a later manufacturing stage in order to form recesses in the semiconductor region 202A within the gate opening 210G, thereby forming corresponding semiconductor fins. On the other hand, the hard mask 220 may reliably cover at least the gate opening 210G formed above the semiconductor region 202B.

The semiconductor regions 202A, 202B may be formed on the basis of any appropriate process strategy, as is, for instance, also discussed above with reference to the device 100. Similarly, the gate mask 210 may be formed, for instance, by depositing one or two appropriate materials, such as silicon dioxide, silicon nitride and the like, and patterning the resulting layer stack so as to form the gate openings 210G therein. In other cases, a mask feature may be formed so as to define the size and position of the gate openings 210G, followed by the deposition and planarization of the material of the gate mask 210. Thereafter, the previously provided mask region may then be removed in order to provide the gate openings 210G. Next, the hard mask 220 may be formed, for instance, by using deposition techniques and sophisticated lithography and etch processes in order to form the mask features 220A and reliably cover the opening 210G in the second semiconductor region 202B.

Figure 2B:
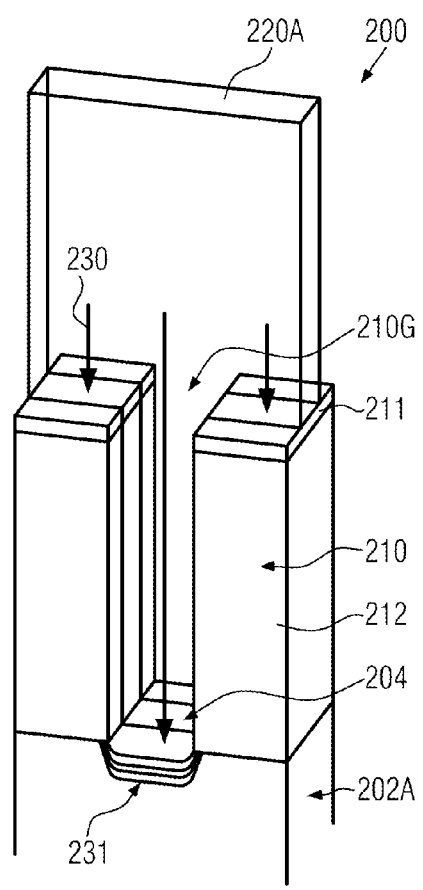
FIGS. 2b-2c schematically illustrate a perspective view of a portion of the semiconductor device upon incorporating a counter-doping species locally in corner areas of a semiconductor fin, according to illustrative embodiments.

FIG. 2b schematically illustrates a portion of the semiconductor device 200 in a further advanced manufacturing stage. As shown, only a portion of the first semiconductor region 202A is illustrated, wherein a single mask feature 220A is formed in the gate opening 210G, which in turn is a part of the gate mask 210 comprising, in the embodiment shown, a first mask layer 212 and a second mask layer 211, for instance provided in the form of silicon dioxide and silicon nitride, respectively. It should be appreciated, however, that any other appropriate material system may be used. Consequently, the hard mask feature 220A covers an area of the semiconductor region 202A within the gate opening 210G, which corresponds to a semiconductor fin 204 still to be formed. Moreover, in this manufacturing stage, the hard mask 220 (FIG. 2a) and thus the feature 220A may be used as an implantation mask during an implantation process 230, in which a dopant species 231 is incorporated into exposed surface areas of the semiconductor region 202A within the gate opening 210G. During the implantation process 230, appropriate implantation parameters, such as dose and energy, are used in order to provide a desired dopant profile for the species 231 within the semiconductor material of the region 202A. For example, a low implantation energy of approximately 0.1-5 keV, or, for instance, a range of 0.5-1 keV, may be used in combination with an appropriate dose so as to obtain a desired dopant concentration. During the implantation process 230, due to the nature of the implantation process, a certain degree of dopant scattering may occur, thereby also incorporating a certain amount of dopant species in the material 202A below the mask feature 220A.

Figure 2C:
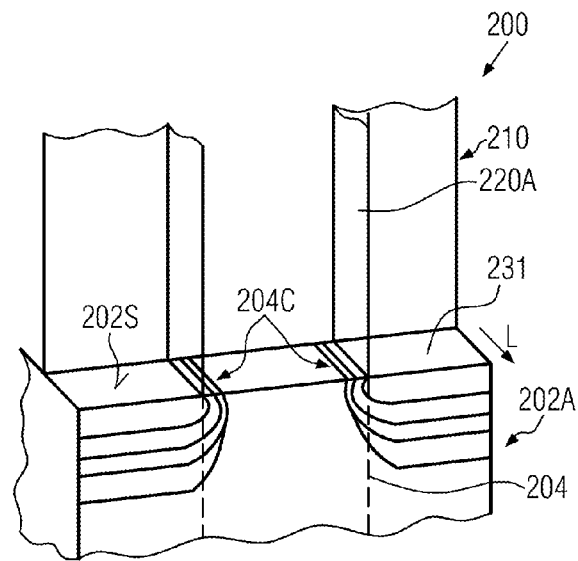

FIG. 2c schematically illustrates a portion of the device as shown in FIG. 2b. As illustrated, the dopant species 231 is incorporated into an exposed portion of the semiconductor material 202A that is not covered by the mask feature 220A, while also, due to dopant scattering, a certain amount of the dopant species is incorporated into an area that corresponds to the semiconductor fin 204 still to be formed. Hence, the dopant species 231 is also present at corner areas 204C of the fins 204 still to be formed. It should be appreciated that, in FIG. 2c, only the left half of the gate opening 210G (FIG. 2b) with respect to a length direction, indicated by L, is illustrated. That is, the gate opening 210G sliced at the half channel length, thus the dopant profile of the species 231 as illustrated in FIG. 2c extends along the entire length of the opening 210G. It should further be appreciated that, in some illustrative embodiments, a concentration maximum of the species 231 is formed at or near the surface of the material 202A within the opening 210G (FIG. 2b), wherein "near the surface" is to be understood as an area ranging from the surface 202S to a depth of approximately 5 nm or less. Consequently, a concentration maximum of the species 231, when provided at a depth of approximately 5 nm and less relative to the surface 202S, may be understood as being positioned at or near the surface 202S.

Figure 2D:
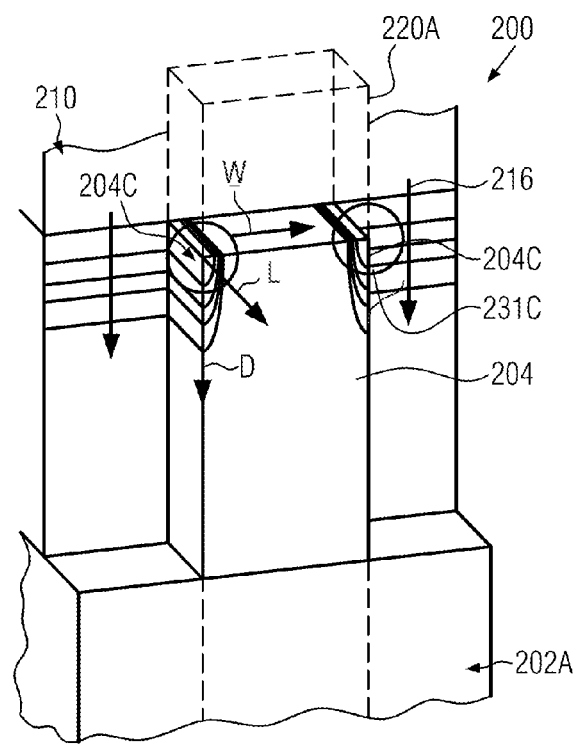
FIG. 2d schematically illustrates a perspective view of the semiconductor fin having an individually adapted dopant concentration with a concentration maximum at a corner area, according to illustrative embodiments.

FIG. 2d schematically illustrates the device 200 in a further advanced manufacturing stage. As shown, an etch process 216 may be applied so as to etch into the semiconductor material 202A while using the hard mask 220 (FIG. 2a) and thus the mask feature 220A as an etch mask. Hence, during the etch process 216, the semiconductor fin 204 is formed by forming corresponding recesses in the semiconductor region 202A down to a desired depth. To this end, any well-established anisotropic etch recipes may be applied. Consequently, during the etch process 216, the main part of the previously incorporated dopant species 231 (FIG. 2c) may be removed, while a portion of the species is preserved in corner areas 204C of the semiconductor fin 204. It should be appreciated that the corner areas 204C are to be understood as areas which have a lateral extension of approximately 5 nm and less along a depth direction, indicated as D, and along a width direction, indicated as W, while the corner areas 204C extend along the length direction L with the entire length of the semiconductor fin. It should be appreciated that, in FIG. 2d, also a slice at half of the transistor length is illustrated. Consequently, within the corner areas 204C, a maximum concentration of the dopant species 231C is provided with a decreasing concentration along the depth direction D and along the width direction W.

Consequently, upon using the mask 220 (FIG. 2a) as an implantation mask and an etch mask for forming the semiconductor fins 204, the dopant species 231C may be provided in a highly localized manner along the entire length of the semiconductor fins 204 within the corner areas 204C substantially without affecting any other transistor areas, and in particular substantially without affecting the semiconductor region 202B (FIG. 2a). After the removal of the hard mask 220 (FIG. 2a), the further processing may be continued on the basis of any appropriate process strategy, for instance by forming gate electrode structures and subsequently forming drain and source regions and the like.

Figure 2E:
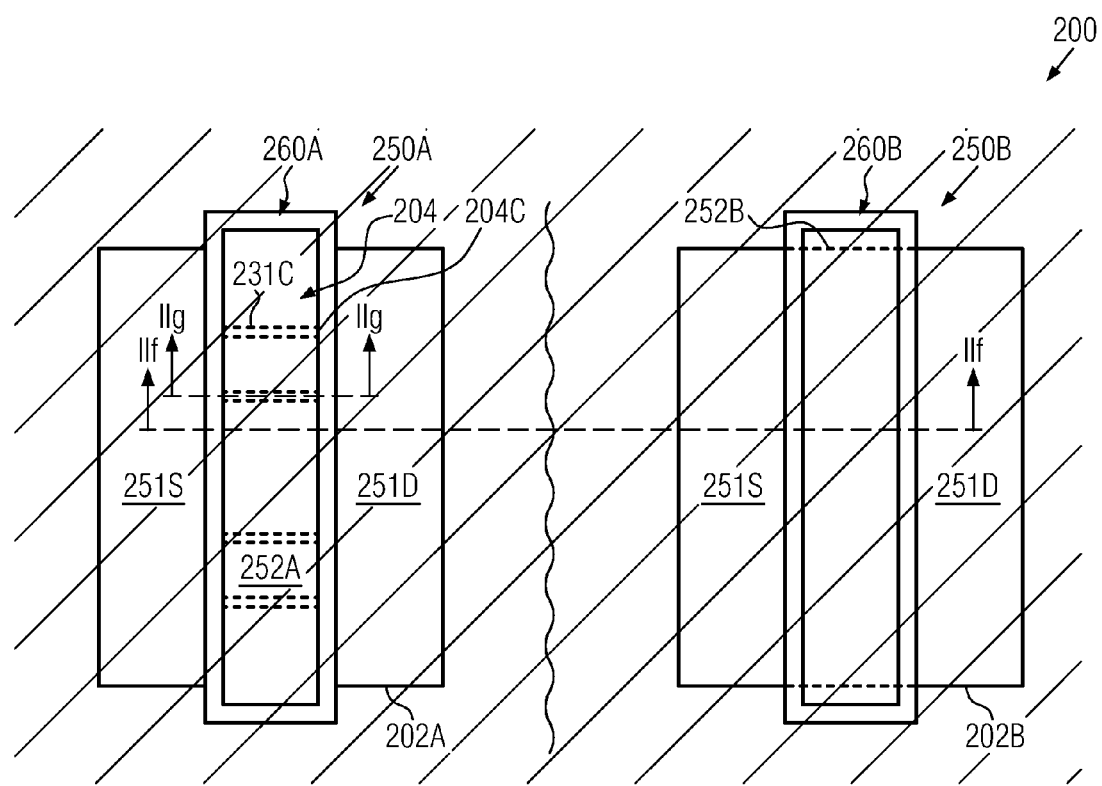
FIG. 2e schematically illustrates a top view of a semiconductor device in a further advanced manufacturing stage, according to illustrative embodiments.

FIG. 2e schematically illustrates a top view of the semiconductor device 200 in a further advanced manufacturing stage. As shown, a multiple gate transistor 250A may be formed in and above the semiconductor region 202A and may comprise a gate electrode structure 260A formed above and laterally adjacent to the semiconductor fins 204. Moreover, a drain region 251D and a source region 251S are formed in the semiconductor region 202A laterally adjacent to the gate electrode structure 260A. Similarly, a planar transistor 250B may be formed in and above the semiconductor region 202B and may comprise a gate electrode structure 260B and drain and source regions 251D, 251S. Due to the planar architecture of the transistor 250B, a planar channel region 252B extends between the drain and source regions 251D, 251S along the entire width of the transistor 250B. On the other hand, the channel region 252A of the multiple gate transistor 250A is formed by the one or more semiconductor fins 204, as discussed above.

Figure 2F:
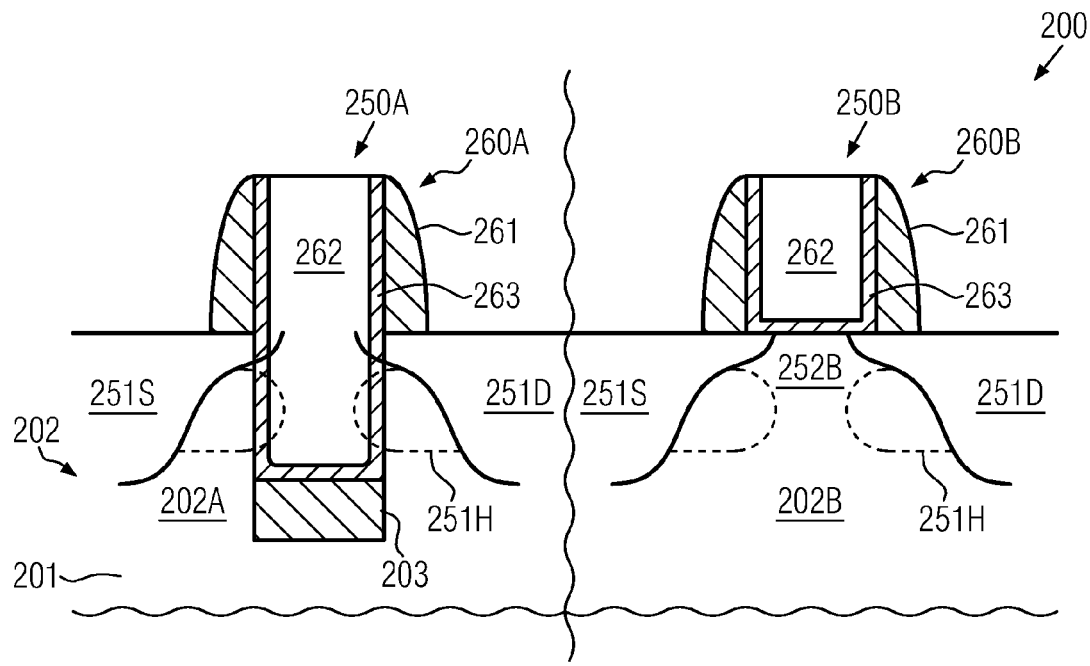
FIGS. 2f-2g schematically illustrate cross-sectional views of the semiconductor device of FIG. 2e.

FIG. 2f schematically illustrates a cross-sectional view of the device 200 along the section IIf of FIG. 2e. As shown, the semiconductor region 202A, formed in a semiconductor layer 202, which in turn is provided above a substrate 201, comprises the drain and source regions 251S, 251D of the transistor 250A. Moreover, the gate electrode structure 260A may comprise a gate dielectric material 263, such as a silicon oxynitride material, a high-k dielectric material and the like, and may thus separate an electrode material 262 from the drain and source regions 251D, 251S and from a well or body region, i.e., the remaining portion of the semiconductor region 202A, which may also comprise counter-doped regions 251H, i.e., counter-doped with respect to the drain and source regions 251D, 251S, wherein any such regions are also frequently referred to as halo regions. Moreover, a dielectric material 203, which determines the electrically effective height of the semiconductor fins, as discussed above, may be provided in the transistor 250A. Furthermore, depending on process and device requirements, a spacer structure 261 is typically formed on sidewalls of the gate electrode structure 260A.

Similarly, the transistor 250B is formed in and above the semiconductor region 202B and may comprise the gate electrode structure 260B having basically the same configuration as the gate electrode structure 260A except for the portion extending into the semiconductor material. Moreover, the drain and source regions 251D, 251S and the halo regions 251H may have substantially the same configuration as in the transistor 250A since these components may be formed on the basis of a common manufacturing sequence.

Figure 2G:
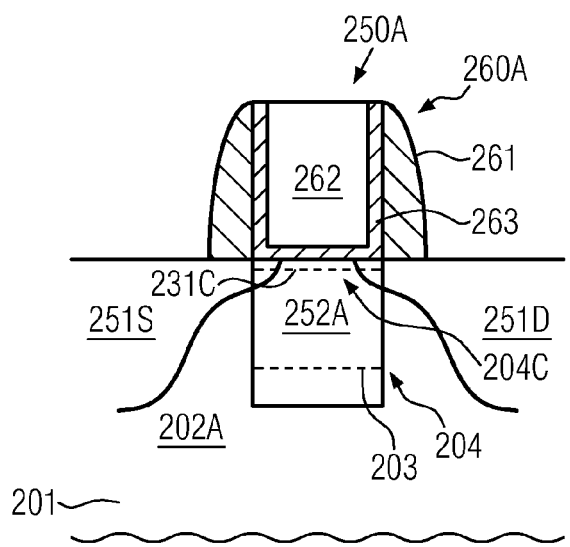

FIG. 2g schematically illustrates a cross-sectional view of the transistor 250A as indicated by the section line IIg in FIG. 2e. Thus, as illustrated, the semiconductor fin 204 may be provided and may extend in the depth direction according to device requirements, as, for instance, shown with reference to FIG. 2d, wherein an electrically effective height is adjusted by the dielectric material 203, which is actually not visible in the section of FIG. 2g. Moreover, the semiconductor fin 204 comprises the corner area 204C having incorporated therein the species 231C having its concentration maximum within the corner area 204C. The species 231C is, in one illustrative embodiment, a counter-doping species with respect to the drain and source regions 251D, 251S, thereby locally reducing the charge carrier density therein in order to efficiently compensate for any corner effects, as, for instance, previously explained with reference to FIGS. 1e and 1f.

The semiconductor device as shown in FIGS. 2e-2g may be formed on the basis of any appropriate process strategy, which may include the deposition of the gate materials into the corresponding gate openings 210G (FIG. 2a) after the removal of the hard mask 220 (FIG. 2a). Thereafter, the gate materials may be deposited by using any appropriate process strategy and excess material may be removed, followed by the removal of the gate mask 210 (FIG. 2a). Next, the spacer structure 261 in combination with the drain and source regions 251S, 251D and the halo regions 251H may be formed by using well-established implantation and masking regimes. Thereafter, additional processes, such as anneal processes, possibly followed by forming contact regions, for instance on the basis of metal silicide, may be applied in order to complete the transistors 250A, 250B. Consequently, the regions 251S, 251D, 251H may be formed commonly for the transistors 250A, 250B, thereby obtaining the required threshold voltage characteristics for the planar transistors 250B, while an efficient shift or adaptation of the threshold voltage behavior of the multiple gate transistor 250A may be accomplished by incorporating the dopant species 231C, as described above. It should be appreciated that the incorporation of the dopant species 231C is to be performed differently for N-channel transistors and P-channel transistors, thereby requiring an additional lithography step, mask removal and cleaning process for each type of transistor. Nevertheless, compared to the very complex process sequence in conventional strategies in which the halo regions are provided separately for multiple gate transistors and planar transistors, thereby also requiring a separation of N-channel transistors and P-channel transistors for each transistor architecture, a significantly reduced overall process complexity may be obtained. Furthermore, the resulting threshold voltage characteristics are improved compared to conventional strategies, as will be described later on in more detail.

Figure 2H:
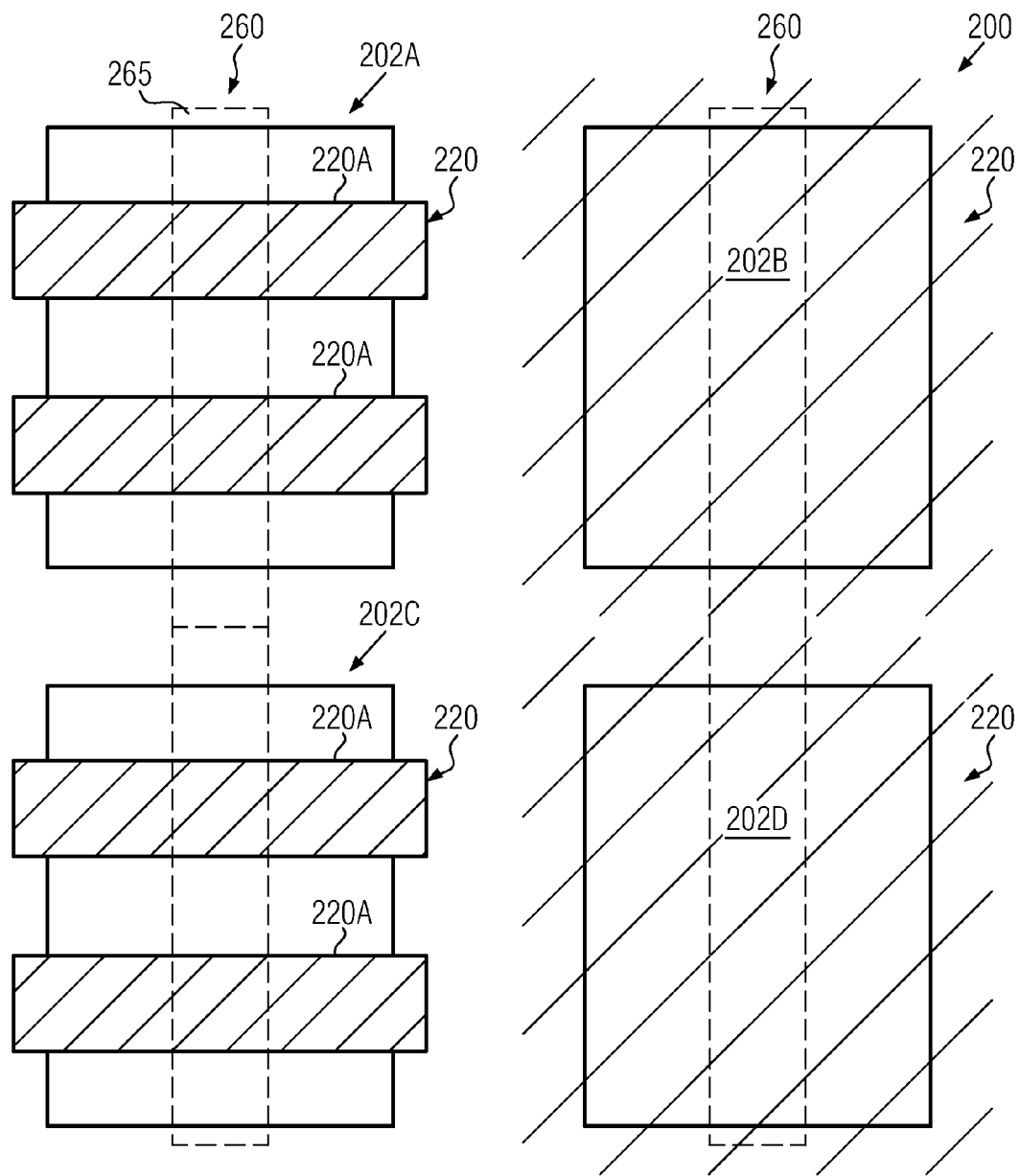
FIGS. 2h-2j schematically illustrate top views of the semiconductor device during various process stages for incorporating a counter-doping species locally restricted in corner areas of semiconductor fins of P-channel transistors and N-channel transistors, respectively.
Figure 2I:
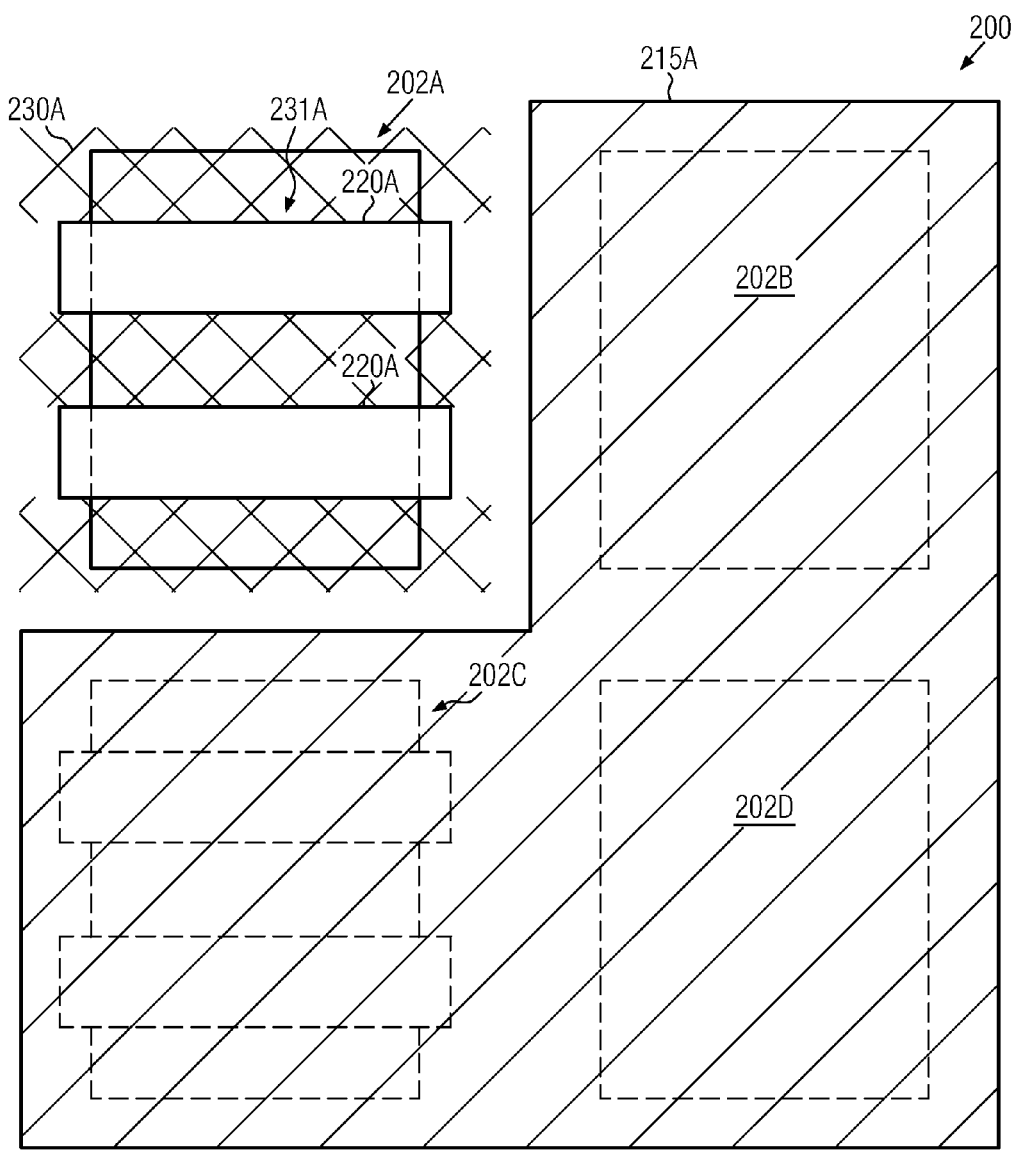
Figure 2J:
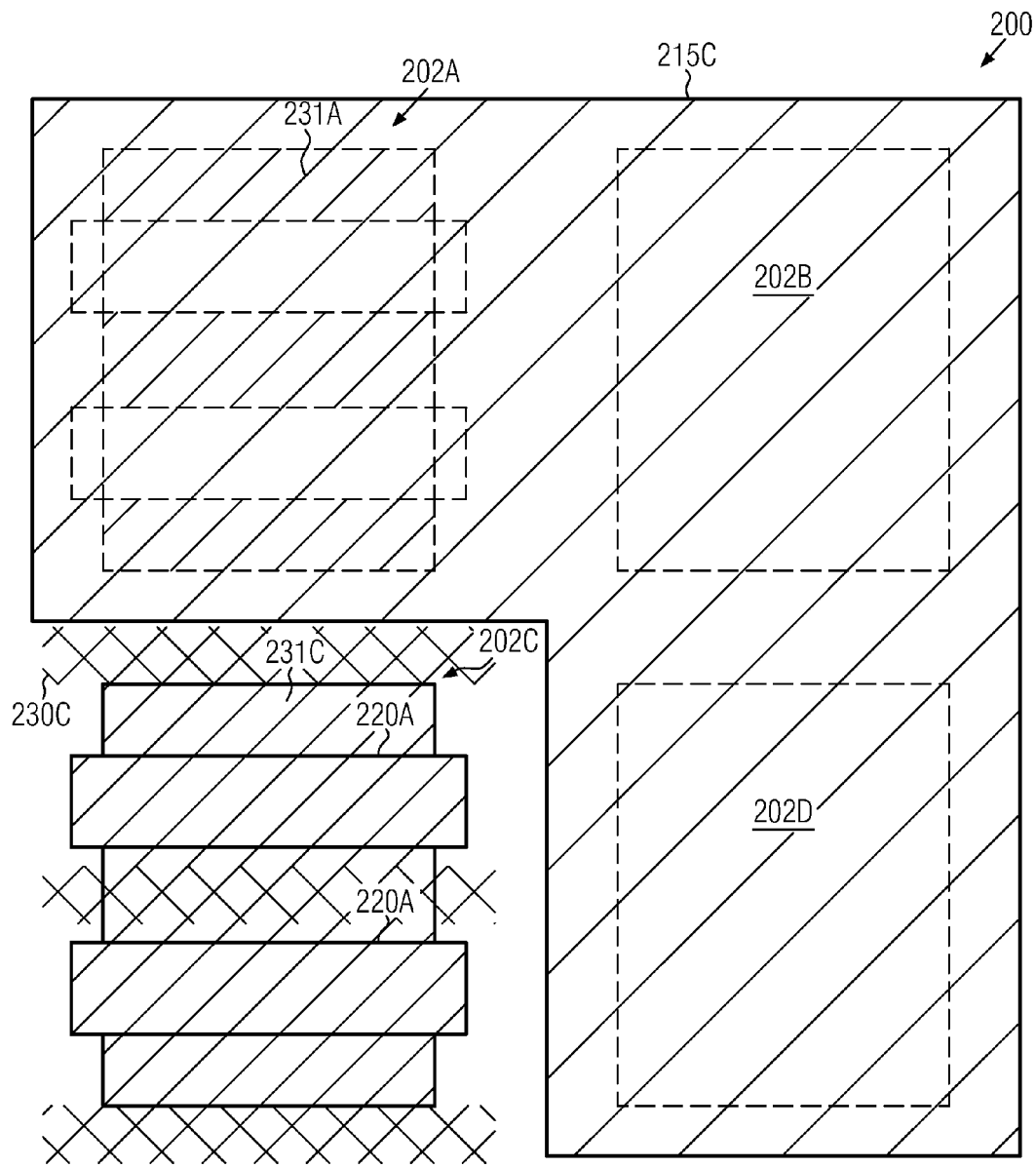

With reference to FIGS. 2h-2j, a process sequence will be described in more detail in which a dopant species may be locally incorporated into the corner areas of the semiconductor fins for two different types of multiple gate transistors, wherein the incorporation may be achieved at any appropriate manufacturing stage.

FIG. 2h schematically illustrates the semiconductor device 200 including the semiconductor regions 202A, 202B in an early manufacturing stage, while also regions 202C and 202D may be provided. The region 202A may receive a multiple gate transistor of a first type while the region 202C may receive a multiple gate transistor of a different type, for instance, an N-channel transistor and a P-channel transistor, respectively, may be provided. On the other hand, planar transistors may be formed in and above the regions 202B, 202D, which may be of the same or different type. To this end, a hard mask 220 is formed so as to comprise the mask features 220A for defining the lateral size and position of semiconductor fins to be formed in the regions 202A, 202C, while the regions 202B, 202D may be completely covered by the mask 220. The hard mask 220 may be provided prior to forming respective gate electrode structures 260, which may comprise a placeholder material 265, which is to be moved and replaced by appropriate gate materials in a very late manufacturing stage.

FIG. 2i schematically illustrates the device 200 in a further advanced manufacturing stage in which an implantation mask 215A, such as a resist mask, is provided so as to expose the region 202A to an ion implantation process 230A in order to incorporate a dopant species 231A into exposed areas of the semiconductor region 202A and also in corner areas of semiconductor fins to be formed on the basis of the mask features 220A. On the other hand, the mask 215A may cover at least the semiconductor region 202C. With respect to any process parameters of the implantation process 230A, the same criteria may apply as previously explained. Thereafter, the mask 215A may be removed, possibly in combination with an appropriate cleaning process.

FIG. 2j schematically illustrates the device 200 with a further implantation mask 215C, which may expose the region 202C to a further implantation process 230C in order to incorporate a desired dopant species 231C into exposed portions of the semiconductor region 202C. In this manner, appropriate threshold voltage characteristics for a transistor to be formed in and above the region 202C may be achieved, as is also discussed above. Also in this case, appropriate implantation parameters may be selected in combination with an appropriate implantation species. Thereafter, the processing may be continued by removing the mask 215C and forming the gate electrode structures 260 including the placeholder material 265 (FIG. 2h). Upon forming the gate electrode structures 260, any exposed portions of the hard mask 220 may be removed and the processing may be continued by forming drain and source regions, halo regions and the like, by applying a common process strategy for corresponding conductivity types of transistors. That is, the semiconductor region 202A may be commonly processed with the region 202B when these regions receive a multiple gate transistor and a planar transistor of the same basic type, such as a P-channel transistor or an N-channel transistor. Similarly, the regions 202C and 202D may be treated in a common process sequence, thereby establishing substantially identical dopant profiles for the drain and source region for each type of transistor, as already discussed above. In a later manufacturing stage, the placeholder material 265 (FIG. 2h) may be removed and the mask features 220A may be used as an etch mask for forming semiconductor fins in the semiconductor regions 220A, 220C. After removing the hard mask 220, appropriate gate materials may be provided, such as high-k dielectric materials, metal-containing electrode materials and the like.

In other strategies, the dopant species 231A, 231C (FIGS. 2i, 2j) may be incorporated upon removing the placeholder material 265 (FIG. 2h) and prior to actually etching into the semiconductor regions 202A, 202C, wherein a corresponding masking regime as described above may be applied.

Consequently, also in this case, an appropriate dopant species may be provided locally in the corner areas of the semiconductor fins, for instance in a very early manufacturing stage or in a very late manufacturing stage, substantially without affecting any planar transistors.

Figure 2K:
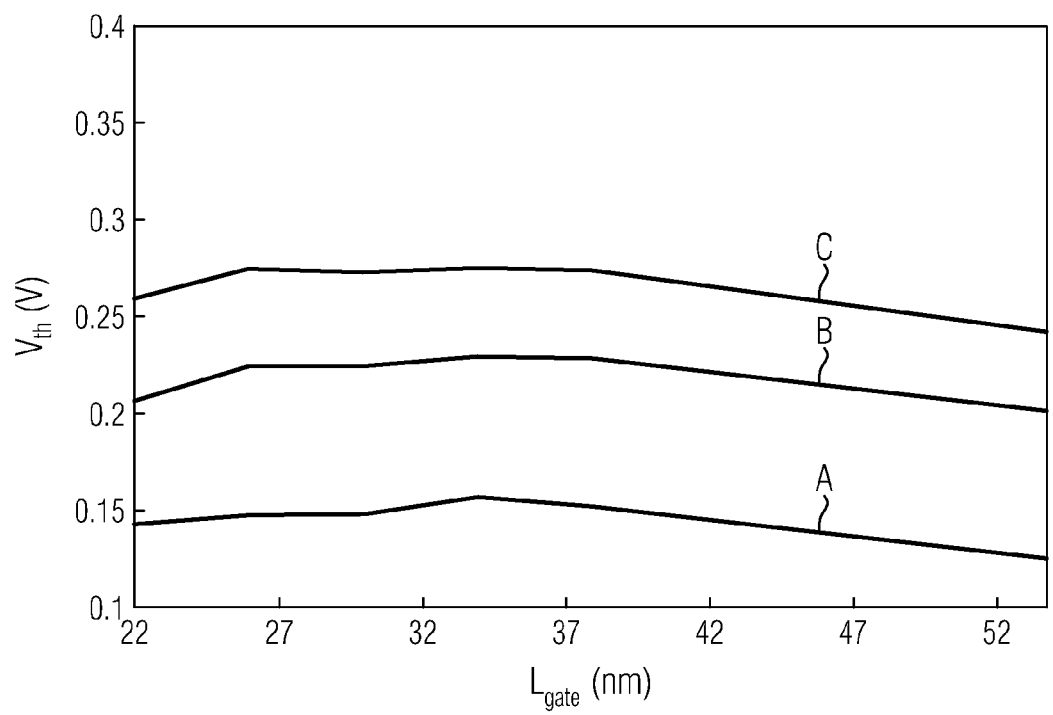
FIG. 2k schematically illustrates a graph indicating the shift of the threshold voltage of multiple gate transistors in relation to a varying counter-doping implantation dose in the corner areas of the semiconductor fins, according to illustrative embodiments.

FIG. 2k schematically illustrates the threshold voltage characteristics of multiple gate transistors having received different concentrations in the corner areas. As shown, curves A, B and C illustrate the threshold voltage for different gate lengths, i.e., for transistors having a gate length of 22-54 nm, wherein curve A indicates the transistors without an additional dopant species in the corner areas. On the other hand, curve B illustrates transistors having received a specific dopant concentration, thereby substantially shifting the threshold voltage characteristic of curve A up to higher threshold voltages. Similarly, curve C represents transistors having received a further increased dopant concentration in the corner areas, thereby even further "degrading" the transistor threshold voltage characteristics, however, without substantially affecting the overall flatness of the threshold voltage dependency. Consequently, by appropriately selecting dose and implantation energy, the concentration in the corner areas may be adjusted so as to obtain the desired shift of the threshold voltage characteristics, thereby enabling a desired adaptation to the threshold voltage characteristics of any planar transistors, which may generally have a higher threshold voltage, as previously explained with reference to FIG. 1d.

As a result, the present disclosure provides manufacturing techniques and semiconductor device in which the threshold voltage characteristics of multiple gate transistors may be adjusted separately with respect to planar transistors while nevertheless enabling a common process sequence for implementing the drain and source regions and the halo regions in the multiple gate transistors and planar transistors. To this end, an appropriate dopant species is incorporated locally in the corner areas of the semiconductor fins, for instance on the basis of a hard mask, which is also used for patterning the semiconductor fins.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a hard mask above a semiconductor region, said hard mask having at least one mask feature that determines a lateral size of a semiconductor fin to be formed in said semiconductor region;
    performing an implantation process to incorporate a dopant species at and near an upper surface of said semiconductor region while using said hard mask as an implantation mask;
    after performing said implantation process, performing an etch process to form said semiconductor fin in said semiconductor region by using said hard mask as an etch mask; and
    forming a gate electrode structure above and laterally adjacent to said semiconductor fin.

2. The method of claim 1, wherein forming said hard mask comprises forming said hard mask so as to comprise at least a second mask feature covering a second semiconductor region to be used for forming therein and thereabove a planar transistor.

3. The method of claim 1, wherein forming a gate electrode structure above and laterally adjacent to said semiconductor fin comprises forming a gate mask having a gate opening and filling said gate opening with one or more materials.

4. The method of claim 3, wherein said hard mask is formed prior to forming said gate mask.

5. The method of claim 3, wherein said gate mask is formed prior to forming said hard mask.

6. The method of claim 5, wherein said implantation process is performed in the presence of said gate mask.

7. The method of claim 1, further comprising forming drain and source regions in said semiconductor region after forming said gate electrode structure.

8. The method of claim 7, wherein forming said drain and source regions comprises concurrently forming second drain and source regions in a second semiconductor region of a planar transistor.

9. The method of claim 7, wherein performing said implantation process comprises to incorporate said dopant species at and near said upper surface of said semiconductor region comprises incorporating said dopant species as a counter-doping species compared to a drain and source dopant species.

10. The method of claim 1, wherein forming said gate electrode structure comprises providing a placeholder structure after forming said hard mask, removing a placeholder material of said placeholder structure and providing gate materials after performing said implantation process and said etch process.

11. A method of forming a semiconductor device, the method comprising:
    forming first drain and source regions of a multiple gate transistor in a first semiconductor region and second drain and source regions of a planar transistor in a second semiconductor region, said multiple gate transistor comprising a semiconductor fin connecting to said first drain and source regions; and
    separately adjusting a threshold voltage of said multiple gate transistor by providing a counter-doping species in said semiconductor fin so as to have a concentration maximum in upper corner regions of said semiconductor fin, wherein said upper corner regions are spaced apart across a width of said semiconductor fin and a concentration of said provided counter-doping species in a region of said semiconductor fin between said upper corner regions is less than said concentration maximum.

12. The method of claim 11, wherein providing said counter-doping species in said semiconductor fin comprises forming a hard mask above said first semiconductor region and said second semiconductor region so as to cover at least a channel region of said planar transistor and determine the size and position of said semiconductor fin of said multiple gate transistor, and performing an implantation process by using said hard mask as an implantation mask.

13. The method of claim 12, further comprising using said hard mask as an etch mask after performing said implantation process so as to form said semiconductor fin.

14. The method of claim 12, wherein said implantation process is performed by using an implantation energy of approximately 0.1-2 keV.

15. The method of claim 11, further comprising masking a second multiple gate transistor when adjusting a threshold voltage of said multiple gate transistor.

16. The method of claim 15, further comprising adjusting a second threshold voltage of said second multiple gate transistor while masking said multiple gate transistor.

17. The method of claim 16, wherein said multiple gate transistor and said second multiple gate transistor are transistors of inverse conductivity type.

18. The method of claim 11, wherein said upper corner regions comprising said provided counter-doping species extend approximately 5 nm or less across an upper surface of said semiconductor fin from upper corners of said semiconductor fin.

19. The method of claim 11 wherein said upper corner regions comprising said provided counter-doping species extend approximately 5 nm or less down a sidewall surface of said semiconductor fin from upper corners of said semiconductor fin.

20. The method of claim 11, wherein said provided counter-doping species is absent from at least a portion of said region of said semiconductor fin between said upper corner regions.

* * * * *